(12) United States Patent
Song et al.

(10) Patent No.: US 12,360,292 B2
(45) Date of Patent: Jul. 15, 2025

(54) LENS ARRAY AND MANUFACTURING METHOD THEREOF

(71) Applicant: BOE Technology Group Co., Ltd., Beijing (CN)

(72) Inventors: Mengya Song, Beijing (CN); Kang Guo, Beijing (CN); Duohui Li, Beijing (CN); Xin Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 17/765,025

(22) PCT Filed: Mar. 16, 2021

(86) PCT No.: PCT/CN2021/080914
§ 371 (c)(1),
(2) Date: Mar. 30, 2022

(87) PCT Pub. No.: WO2022/193107
PCT Pub. Date: Sep. 22, 2022

(65) Prior Publication Data
US 2023/0358922 A1 Nov. 9, 2023

(51) Int. Cl.
*G02B 3/00* (2006.01)

(52) U.S. Cl.
CPC .......... *G02B 3/0018* (2013.01); *G02B 3/005* (2013.01)

(58) Field of Classification Search
CPC .... G02B 3/0018; G02B 3/005; G02B 3/0056; H01L 27/146
See application file for complete search history.

(56) References Cited

U.S. PATENT DOCUMENTS

| 6,898,014 | B2 | 5/2005 | Ohgaki | |
| 2010/0331929 | A1* | 12/2010 | Burrows | A61M 21/00 |
| | | | | 359/641 |
| 2012/0105928 | A1* | 5/2012 | Camus | G07D 7/003 |
| | | | | 359/627 |
| 2013/0070343 | A1 | 3/2013 | Engelhardt | |
| 2014/0293384 | A1* | 10/2014 | O'keeffe | C22C 5/02 |
| | | | | 359/2 |

(Continued)

FOREIGN PATENT DOCUMENTS

| CN | 103022063 A | 4/2013 |
| JP | 2000196052 A | 7/2000 |

*Primary Examiner* — Wyatt A Stoffa
*Assistant Examiner* — John Curtis Sipes
(74) *Attorney, Agent, or Firm* — IPro, PLLC

(57) ABSTRACT

Disclosed in embodiments of the present disclosure are a lens array and a manufacturing method thereof. The manufacturing method for the lens array includes the following steps: depositing a first film layer on a first substrate, and manufacturing and forming a tapered structure array through a patterning process; and depositing a second film layer on the tapered structure array, thereby covering a top of a tapered structure, so as to form a lenticular structure array, wherein a top of a lenticular structure is a cambered surface. The lens array is manufactured by the above manufacturing method, wherein the lens array includes a plurality of lenses arranged in an array, and the arch heights of the plurality of lenses are the same and larger than or equal to a set value.

18 Claims, 4 Drawing Sheets

(56) References Cited

U.S. PATENT DOCUMENTS

| | | | |
|---|---|---|---|
| 2015/0207030 A1* | 7/2015 | Tang | H01L 33/20 |
| | | | 257/98 |
| 2017/0110330 A1* | 4/2017 | Choi | H01L 21/30604 |
| 2020/0004029 A1* | 1/2020 | Godet | G02B 5/18 |
| 2020/0174371 A1* | 6/2020 | Duan | B05D 1/02 |
| 2020/0347393 A1* | 11/2020 | Park | C12N 15/8207 |

* cited by examiner

LENS ARRAY AND MANUFACTURING METHOD THEREOF

CROSS REFERENCE TO RELATED APPLICATIONS

The present disclosure is a National Stage of International Application No. PCT/CN2021/080914, filed Mar. 16, 2021.

FIELD

The present application relates to the technical field of microlenses, in particular to a lens array and a manufacturing method thereof.

BACKGROUND

At present, an existing nano-imprint lens template is formed by photoetching thermal reflow process, manufacturing of lens structures with high arch heights by the thermal reflow method has great limitations, however, the lens structures with high arch heights are needed in some projects, and the structures cannot be manufactured only by the current photoetching thermal reflow process.

SUMMARY

The present application discloses a lens array and a manufacturing method thereof and aims to provide a manufacturing method for a lens array with a high arch height.

In order to achieve the above purpose, the present application provides the following technical solutions.

A manufacturing method for a lens array includes:
depositing a first film layer on a first substrate:
forming a tapered structure array through a patterning process; and
depositing a second film layer on the tapered structure array, while the second film layer covers a top of a tapered structure, so as to form a lenticular structure array, and a top of a lenticular structure is a cambered surface.

In some embodiments, the depositing the first film layer on the first substrate, and forming the tapered structure array through the patterning process include:
coating a third film layer on the first film layer;
forming the third film layer into a grating structure pattern; and
etching the first film layer to form the tapered structure array by using the grating structure pattern as a mask.

In some embodiments, the etching the first film layer to form the tapered structure array, include:
adopting a dry-etching process to etch the first film layer to form the tapered structure array.

In some embodiments, the forming the third film layer into the grating structure pattern, include:
forming a rectangular grating structure pattern; and
the etching the first film layer to form the tapered structure array, include:
etching the first film layer to form a pyramid structure array.

In some embodiments, the etching the first film layer to form the pyramid structure array, include:
etching the first film layer to form a triangular pyramid structure array.

In some embodiments, the forming the third film layer into the grating structure pattern, include:
forming a circular grating structure pattern; and the etching the first film layer to form the tapered structure array, include:
etching the first film layer to form a conical structure array.

In some embodiments, the coating the third film layer on the first film layer, and forming the third film layer into the grating structure pattern, include: coating a first nano-imprint adhesive layer on the first film layer, and adopting a nano-imprint process to form the grating structure pattern on the first nano-imprint adhesive layer.

In some embodiments, the coating the third film layer on the first film layer, and forming the third film layer into the grating structure pattern, include:
coating a photoresist layer on the first film layer, and adopting a photoetching process to form the grating structure pattern.

In some embodiments, the manufacturing method for the lens array further includes:
adopting the lenticular structure array as a template to form the lens array by two times of nano-imprint rubber transfer process.

In some embodiments, the adopting the lenticular structure array as the template to form the lens array by two times of nano-imprint rubber transfer process, include:
providing a second substrate:
depositing a second nano-imprint adhesive layer on the second substrate:
taking the lenticular structure array as an imprint template, and forming a lenticular groove array in the second nano-imprint adhesive layer by the nano-imprint process:
providing a third substrate;
depositing a third nano-imprint adhesive layer on the third substrate; and
taking the lenticular groove array as an imprint template, and forming a cylindrical lens array on the third nano-imprint adhesive layer by the nano-imprint process.

In some embodiments, a transmittance of the third nano-imprint adhesive layer is larger than a transmittance of at least one of the first film layer or the second film layer; and/or a refractive index of the third nano-imprint adhesive layer is larger than a refractive index of at least one of the first film layer or the second film layer.

In some embodiments, the depositing the first film layer on the first substrate, includes: depositing a SiO2 film layer on the first substrate.

In some embodiments, the depositing the second film layer on the tapered structure array, includes: depositing a metal film layer on the tapered structure array.

In some embodiments, the depositing the second film layer on the tapered structure array, includes: adopting any one of chemical vapor deposition, magnetron sputtering deposition or an evaporation process to deposit the second film layer.

A lens array, manufactured by the any above manufacturing method, includes a plurality of lenses arranged in an array, a the vaults of arch heights of the plurality of lenses are a same vault; and the vaults of arch heights are larger than or equal to a set value.

In some embodiments, the set value is 30 μm.

In some embodiments, a gap is provided between adjacent lenses.

In some embodiments, bottoms of the adjacent lenses are connected with each other.

DETAILED DESCRIPTION OF THE EMBODIMENTS

Figure 1:
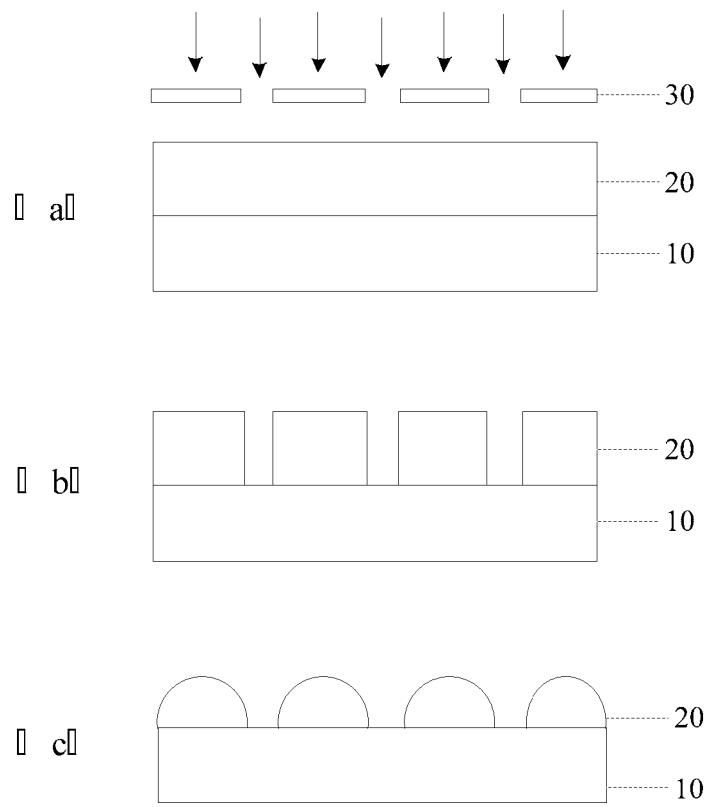
FIG. 1 is a schematic diagram of a process for manufacturing a microlens array by adopting a photoetching thermal reflow method.

At present, the existing nano-imprint lens template is provided by photoetching thermal reflow: FIG. 1 is a flow chart of a process for manufacturing a microlens by photo-etching thermal reflow; which mainly includes the following steps:
- (a) a photoresist 20 on a substrate 10 is exposed under shielding of a mask 30, where an exposure pattern is circular, rectangular or long-strip-shaped, and FIG. 1 takes a rectangle as an example:
- (b) the exposed photoresist 20 is developed, and residual materials are cleaned to obtain a pattern of the photoresist 20; and
- (c) the substrate 10 is put on a heating platform, so as to melt the pattern of the photoresist 20 into a shape of the microlens.

Figure 2:
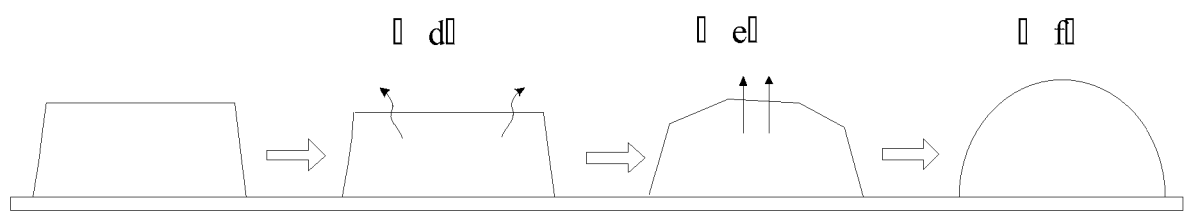
FIG. 2 is a schematic diagram of morphology changes of a photoresist pattern during thermal reflow.

FIG. 2 is a schematic diagram of morphology changes of a photoresist pattern during thermal reflow; which includes: (d) a residual solvent in the photoresist is volatilized, and a volume of the pattern is slightly reduced: (e) beginning of thermal reflow: molecular motion energy and fluidity are increased, a microlens contour begins to form, the volume is not changed, a slope angle is reduced, and an arch height is increased; and (f) releasing of stress: in the cooling process, the stress is released to a balanced state, a microlens morphology is formed, the volume is not changed, and the slope angle tends to be stable. As shown in FIG. 2, the arch height of a lens manufactured by the thermal reflow process is limited by the coating thickness and process, generally within 5 μm to 30 μm, which is difficult to meet the demand for arch heights of lens structures in some current projects.

Based on the above research situation, the present application discloses a lens array and a manufacturing method thereof, and aims to provide a manufacturing method for the lens array, which can manufacture a lens with a high arch height, so as to meet the current demand for lens products with high arch heights in various fields.

The technical solutions in the embodiments of the present application will be clearly and completely described below in conjunction with drawings in the embodiments of the present application, obviously, the described embodiments are only a part of the embodiments of the present application, not all of the embodiments. Based on the embodiments in the present application, all other embodiments acquired by those of ordinary skill in the art without creative work shall fall within the protection scope of the present application.

Figure 3:
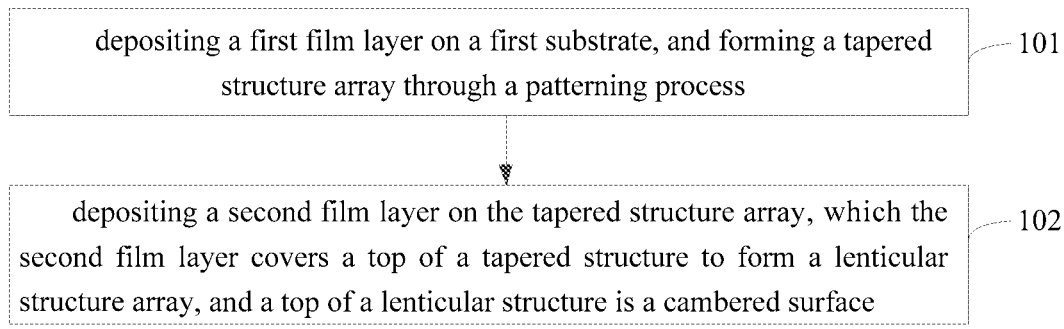
FIG. 3 is a flow chart of a manufacturing method for a lens array provided by an embodiment of the present application.

As shown in FIG. 3, embodiments of the present application provide a manufacturing method for a lens array, including the following steps:
- step 101, referring to (a). (b) and (c) in FIG. 4, a first film layer 21 is deposited on a first substrate 11, and a tapered structure 210 array is formed through a patterning process; and
- step 102, referring to (d) in FIG. 4, a second film layer 22 is deposited on the tapered structure 210 array, which the second film layer covers a top of a tapered structure 210, so as to form a lenticular structure 3 array, and a top of a lenticular structure 3 is a cambered surface.

In the manufacturing method for the lens array provided by embodiments of the present application, firstly, the tapered structure array is manufactured and formed by adopting the patterning process, and then a sharp corner of the tapered structure array is covered through a mode of depositing the film layer, so as to form the smooth lenticular structure array. The manufacturing method is not limited by the thermal reflow process, the range of an arch height can be greatly improved, the lens array with the high arch height can be manufactured and formed, the range of process adjustment capability is greatly broadened, the possibility is provided for manufacturing a lens device with the high arch height and high performance, and the advantage of simple and feasible operation is achieved.

In some embodiments, for the lens array obtained by the manufacturing method for the lens array provided by the embodiment of the present application, the arch height of the lens may reach more than 30 μm. A thickness of film layer deposition and parameters of the patterning process may be adjusted to achieve an effect of different arch heights, which can well meet the demand for lens products with different arch heights in various fields.

Figure 4:
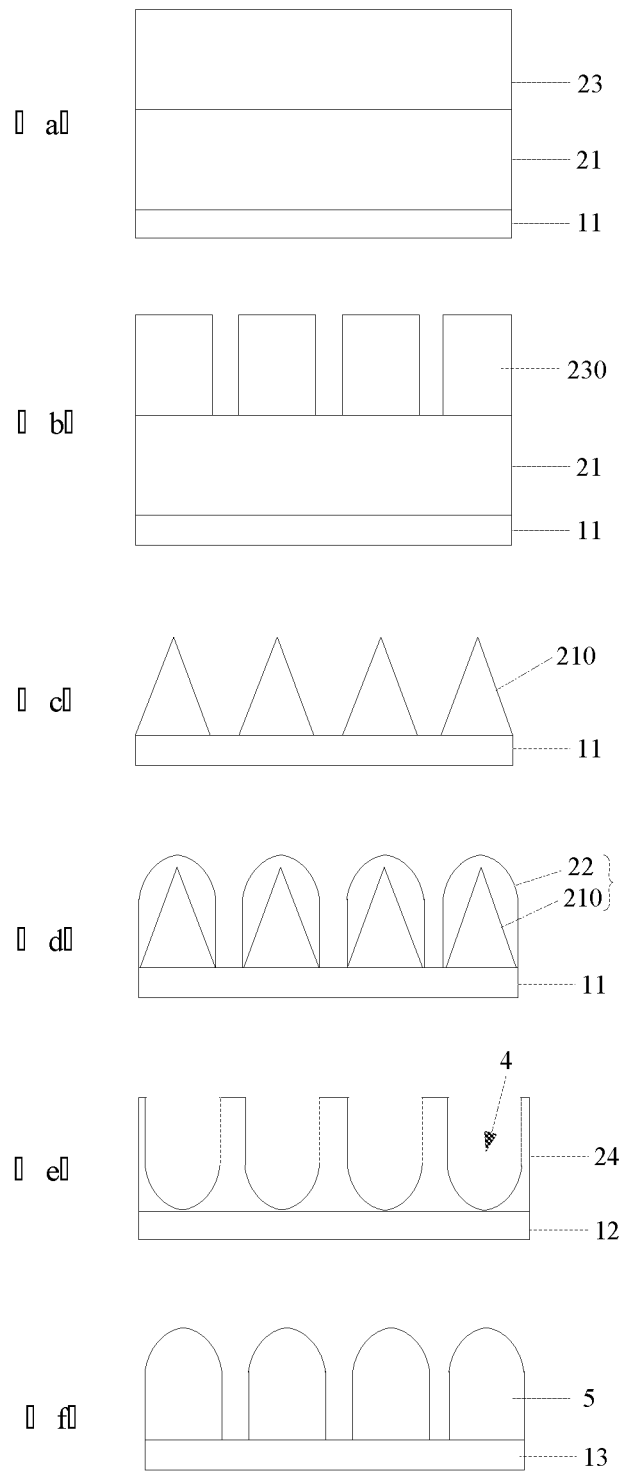
FIG. 4 is a schematic diagram of process of a manufacturing method for a lens array provided by an embodiment of the present application.

In some embodiments, step 101 that the first film layer is deposited on the first substrate, and the tapered structure array is manufactured and formed through the patterning process may include the following steps:
- step 201, referring to (a) and (b) in FIG. 4, a third film layer 23 is coated on the first film layer 21, and the third film layer is formed into a grating structure 230 pattern; and
- step 202, referring to (b) and (c) in FIG. 4, the grating structure 230 pattern is taken as a mask, and the first film layer 21 is etched to form the tapered structure 210 array.

In some embodiments, step 202 that the first film layer is etched to form the tapered structure array may include:
a dry-etching process is adopted to etch the first film layer so as to form the tapered structure array.

In some embodiments, step 201 that the grating structure pattern is formed includes: a rectangular grating structure pattern is formed. In other words, a formed grating structure is a plurality of rectangular blocks arranged in an array.

Furthermore, step 202 that the first film layer is etched to form the tapered structure array includes: the first film layer is etched to form a pyramid structure array. In other words, an etched and formed tapered structure is a pyramid structure.

In some embodiments, step 202 may be the first film layer is etched to form a triangular pyramid structure array.

In some embodiments, step 201 that the grating structure pattern is formed includes: a circular grating structure pattern is formed. In other words, the formed grating structure is a plurality of circular structures arranged in an array.

In some embodiments, step 202 that the first film layer is etched to form the tapered structure array includes: the first film layer is etched to form a conical structure array. In other words, the etched and formed tapered structure is a conical structure.

Of course, in the manufacturing method of embodiments of the present application, the grating structure is not limited to a rectangular grating or a circular grating, and the tapered structure is also not limited to a pyramid or a cone. The grating structure and the tapered structure may have other shapes, which can be subjected to the final shape obtained according to process parameters in the actual operation.

In some embodiments, in step 201, a nano-imprint process may be adopted to form a grating structure.

In some embodiments, step 201 that the third film layer is coated on the first film layer, and the third film layer is formed into the grating structure pattern, may include the following steps:

a first nano-imprint adhesive layer is coated on the first film layer, and the nano-imprint process is adopted to form the grating structure pattern on the first nano-imprint adhesive layer.

In some embodiments, in step 201, a photoetching process may be adopted to form the grating structure.

In some embodiments, step 201 that the third film layer is coated on the first film layer, and the third film layer is formed into the grating structure pattern may include the following steps:

a photoresist layer is coated on the first film layer, and the photoetching process is adopted to form the grating structure pattern.

Based on the above embodiments, the manufacturing method for the lens array provided by embodiments of the present application may further includes the following steps:

step 103, referring to (d), (e) and (f) in FIG. 4, the lenticular structure 3 array is adopted as a template, and a nano-imprint adhesive material is transferred twice to obtain the lens array 5.

In some embodiments, step 103 that the lenticular structure array is adopted as the template, and the nano-imprint adhesive material is transferred twice to obtain the lens array may specifically include the following steps:

step 301, referring to (d) and (e) in FIG. 4, a second substrate 12 is provided, and a second nano-imprint adhesive layer 24 is deposited on the second substrate 12; the lenticular structure 3 array is taken as an imprint template, and a lenticular groove 4 array is formed in the second nano-imprint adhesive layer 24 by the nano-imprint process; and step 302, referring to (e) and (f) in FIG. 4, a third substrate 13 is provided, and a third nano-imprint adhesive layer is deposited on the third substrate 13; and the lenticular groove 4 array is taken as an imprint template, and a lens 5 array is formed on the third nano-imprint adhesive layer by the nano-imprint process.

In some embodiments, the lenticular structure array formed in step 102 includes: a two-layer structure of the first film layer and the second film layer, a pattern of the first film layer and a pattern of the second film layer are limited by the manufacturing process, and the refractive index and transmittance may not be able to meet the requirements of an optical lens array. Therefore, a lens array that meets the requirements of an optical lens may be obtained by transferring the nano-imprint adhesive material twice.

In some embodiments, a transmittance of the third nano-imprint adhesive layer finally used to form the lens array is larger than a transmittance of at least one of the first film layer or the second film layer; and/or a refractive index of the third nano-imprint adhesive layer is larger than a refractive index of at least one of the first film layer or the second film layer.

In some embodiments, the first film layer may be a SiO2 film layer, that is, step 101 that the first film layer is deposited on the first substrate includes: the SiO2 film layer is deposited on the first substrate.

In some embodiments, a thickness of the deposited SiO2 film layer may range from 20 μm to 100 μm, which may be adjusted according to the demand for the arch height of the lens.

In some embodiments, the SiO2 film layer may be formed by adopting a chemical vapor deposition process, and the specific process conditions may be: the power is 400 W under a temperature of 150° C.

In some embodiments, the second film layer may be a metal film layer, that is, step 102 that the second film layer is deposited on the tapered structure array includes: the metal film layer is deposited on the tapered structure array.

Of course, the first film layer is not limited to the SiO2 film layer, the second film layer is also not limited to the metal film layer, and the first film layer and the second film layer may also be made of other materials, as long as they can meet the demands of deposition and patterning.

In some embodiments, step 102 that the second film layer is deposited on the tapered structure array may include:

any one of chemical vapor deposition (CVD), magnetron sputtering deposition (Sputter) or an evaporation process is adopted to deposit and form the second film layer.

In addition, embodiments of the present application further provide a lens array, which is manufactured by the any above manufacturing method. Referring to (f) in FIG. 4 and FIG. 5, the lens array includes a plurality of lenses 5 arranged in an array, and arch heights h of the plurality of lenses 5 are the same and larger than or equal to a set value.

In some embodiments, the set value is 30 μm. For example, the arch height of each lens in the lens array may be 30 μm, 35 μm and 40 μm.

In some embodiments, referring to (f) in FIG. 4, in the lens array provided by embodiments of the present application, a gap is provided between the adjacent lenses 5.

Figure 5:
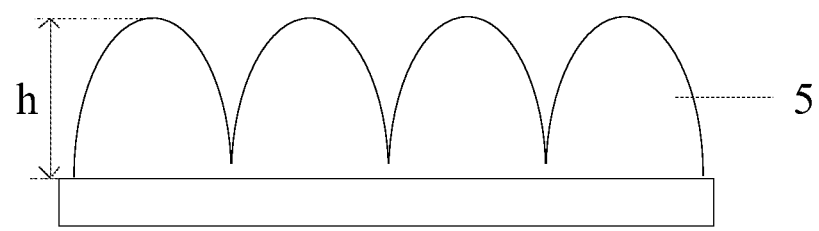
FIG. 5 is a structural schematic diagram of a lens array provided by an embodiment of the present application.

In some embodiments, referring to FIG. 5, in the lens array provided by embodiments of the present application, bottoms of the adjacent lenses 5 are connected with each other, that is, the lens array is a close-connected lens array.

In some embodiments, whether the lenses are closely connected or form gaps can be achieved by adjusting parameters in the manufacturing process. For example, it can be achieved by adjusting any one or more of the parameters such as a gap between grating structures, etching time of the first film layer and a deposition thickness of the second film layer.

In addition, it should be noted that in the manufacturing method for the lens array of the present disclosure, the process is not limited to the above embodiments of the present disclosure, moreover, a shape of each structure and the parameters of the process provided by the present disclosure are only examples of some embodiments of the present application, and the solution of the present disclosure is not limited to this.

Obviously, those skilled in the art can make various changes and modifications to the embodiments of the present application without departing from the spirit and scope of the present application. As such, provided that these modifications and variations of the present application fall within the scope of the claims of the present application and their equivalents, the present application is also intended to cover such modifications and variations.

What is claimed is:

1. A manufacturing method for a lens array, comprising:
   depositing a first film layer on a first substrate;
   forming a tapered structure array through a patterning process; and depositing a second film layer on the tapered structure array;
wherein the second film layer covers a top of a tapered structure to form a lenticular structure array, and a top of a lenticular structure is a cambered surface;
wherein the method further comprises:
adopting the lenticular structure array as a template to form the lens array by two times of nano-imprint rubber transfer process;
wherein the adopting the lenticular structure array as the template to form the lens array by two times of nano-imprint rubber transfer process, comprise:
providing a second substrate;
depositing a second nano-imprint adhesive layer on the second substrate;
taking the lenticular structure array as an imprint template, and forming a lenticular groove array in the second nano-imprint adhesive layer by the nano-imprint process;
providing a third substrate;
depositing a third nano-imprint adhesive layer on the third substrate; and
taking the lenticular groove array as an imprint template, and forming a cylindrical lens array on the third nano-imprint adhesive layer by the nano-imprint process.

2. The manufacturing method for the lens array according to claim 1, wherein the depositing the first film layer on the first substrate, and forming the tapered structure array through the patterning process, comprise:
coating a third film layer on the first film layer;
forming the third film layer into a grating structure pattern; and
etching the first film layer to form the tapered structure array by using the grating structure pattern as a mask.

3. The manufacturing method for the lens array according to claim 2, wherein the etching the first film layer to form the tapered structure array, comprise:
adopting a dry-etching process to etch the first film layer to form the tapered structure array.

4. The manufacturing method for the lens array according to claim 2, wherein
the forming the third film layer into the grating structure pattern, comprise:
forming a rectangular grating structure pattern; and
the etching the first film layer to form the tapered structure array, comprise:
etching the first film layer to form a pyramid structure array.

5. The manufacturing method for the lens array according to claim 4, wherein the etching the first film layer to form the pyramid structure array, comprise:
etching the first film layer to form a triangular pyramid structure array.

6. The manufacturing method for the lens array according to claim 2, wherein
the forming the third film layer into the grating structure pattern, comprise:
forming a circular grating structure pattern; and
the etching the first film layer to form the tapered structure array, comprise:
etching the first film layer to form a conical structure array.

7. The manufacturing method for the lens array according to claim 2, wherein the coating the third film layer on the first film layer, and forming the third film layer into the grating structure pattern, comprise:
coating a first nano-imprint adhesive layer on the first film layer; and
adopting a nano-imprint process to form the grating structure pattern on the first nano-imprint adhesive layer.

8. The manufacturing method for the lens array according to claim 2, wherein the coating the third film layer on the first film layer, and forming the third film layer into the grating structure pattern, comprise:
coating a photoresist layer on the first film layer; and
adopting a photoetching process to form the grating structure pattern.

9. The manufacturing method for the lens array according to claim 1, wherein a transmittance of the third nano-imprint adhesive layer is larger than a transmittance of at least one of the first film layer or the second film layer; and/or
a refractive index of the third nano-imprint adhesive layer is larger than a refractive index of at least one of the first film layer or the second film layer.

10. The manufacturing method for the lens array according to claim 1, wherein the depositing the first film layer on the first substrate, comprise:
depositing a SiO$_2$ film layer on the first substrate.

11. The manufacturing method for the lens array according to claim 1, wherein the depositing the second film layer on the tapered structure array, comprise:
depositing a metal film layer on the tapered structure array.

12. The manufacturing method for the lens array according to claim 1, wherein the depositing the second film layer on the tapered structure array, comprises:
adopting any one of chemical vapor deposition, magnetron sputtering deposition or an evaporation process to deposit the second film layer.

13. A lens array, manufactured by the manufacturing method according to claim 1, wherein the lens array comprises a plurality of lenses arranged in an array;
the vaults of arch heights of the plurality of lenses are a same vault; and
the vaults of arch heights are larger than or equal to a set value.

14. The lens array according to claim 13, wherein the set value is 30 μm.

15. The lens array according to claim 14, wherein a gap is provided between adjacent lenses.

16. The lens array according to claim 14, wherein bottoms of adjacent lenses are connected with each other.

17. The manufacturing method for the lens array according to claim 1, wherein a transmittance of the third nano-imprint adhesive layer is larger than a transmittance of at least one of the first film layer or the second film layer.

18. The manufacturing method for the lens array according to claim 1, wherein a refractive index of the third nano-imprint adhesive layer is larger than a refractive index of at least one of the first film layer or the second film layer.

* * * * *